US007885625B2

(12) United States Patent
Muhammad et al.

(10) Patent No.: US 7,885,625 B2
(45) Date of Patent: Feb. 8, 2011

(54) RF A/D CONVERTER WITH PHASED FEEDBACK TO LOW NOISE AMPLIFIER

(75) Inventors: Khurram Muhammad, Dallas, TX (US); Meng-Chang Lee, Richardson, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 891 days.

(21) Appl. No.: 11/717,563

(22) Filed: Mar. 13, 2007

(65) Prior Publication Data

US 2008/0227424 A1  Sep. 18, 2008

(51) Int. Cl.
*H04B 1/06* (2006.01)
*H04B 7/00* (2006.01)
*H04L 27/08* (2006.01)

(52) U.S. Cl. ............ 455/232.1; 455/234.2; 455/235.1; 455/236.1; 455/239.1; 455/240.1; 455/234.1; 455/245.1; 455/247.1; 455/250.1; 375/345

(58) Field of Classification Search ............ 455/232.1, 455/234.1, 234.2, 235.1, 236.1, 239.1, 240.1, 455/245.1, 247.1, 250.1; 375/345
See application file for complete search history.

(56) References Cited

U.S. PATENT DOCUMENTS

| | | | |
|---|---|---|---|
| 7,483,500 B2 * | 1/2009 | Takatz et al. | 375/345 |
| 2002/0047729 A1 * | 4/2002 | Hirata et al. | 327/50 |
| 2005/0143032 A1 * | 6/2005 | Matsushita et al. | 455/232.1 |
| 2005/0169401 A1 * | 8/2005 | Abraham et al. | 375/295 |
| 2006/0111074 A1 * | 5/2006 | Petilli et al. | 455/334 |
| 2006/0227907 A1 * | 10/2006 | Lim | 375/345 |
| 2007/0140382 A1 * | 6/2007 | Qian | 375/332 |
| 2008/0070535 A1 * | 3/2008 | Liou | 455/232.1 |

* cited by examiner

*Primary Examiner*—Matthew D. Anderson
*Assistant Examiner*—Wen W Huang
(74) *Attorney, Agent, or Firm*—Lawrence J. Bassuk; W. James Brady; Frederick J. Telecky, Jr.

(57) ABSTRACT

Methods and apparatus to perform radio frequency (RF) analog-to-digital conversion are described. According to one example, a receiver includes an amplifier to amplify received analog RF signals and a mixer-free circuit for converting the received analog RF signals to digital signals.

11 Claims, 14 Drawing Sheets

RF A/D CONVERTER WITH PHASED FEEDBACK TO LOW NOISE AMPLIFIER

TECHNICAL FIELD

The present disclosure pertains to communication systems and, more particularly, to methods and apparatus to perform radio frequency (RF) analog-to-digital (A/D) conversion.

BACKGROUND

Low-power wireless receivers are very important for a multitude of applications. For example, a mobile handset such as a cellular telephone or the like may include various portions of circuitry, one of which is a low-power receiver that enables the mobile handset to receive information (e.g., voice, data, etc.) from a transmitter. Such receivers may be used in communication systems operating using wireless protocols such as Bluetooth, Zigbee, etc. Wireless receivers typically consume 5-10 milliamperes (mA) of current. It would be desirable to reduce this current consumption even further.

In an effort to reduce current consumption further, some designs include regenerative receiver, super-regenerative receiver, etc. However, the drawback to receivers such as super-regenerative receivers is that such receivers typically have both poor linearity and poor blocking performance. An additional or alternative approach to reducing receiver current consumption is to reduce the number of analog stages required in the receiver, thereby making a more digital receiver.

DETAILED DESCRIPTION

Methods and apparatus for performing RF A/D conversion are disclosed herein. The example methods and apparatus provide a mixer-free solution and, therefore, RF A/D conversion provides a low-power, highly digital receiver. As described herein, an A/D converter operates on the RF input directly, thereby eliminating a need to have analog baseband stages. That is, the A/D converter directly converts the input RF signal to a digital output data stream via a single-bit or a multi-bit quantizer. To provide a low-noise feedback signal, a simple A/D converter at the output of a low noise amplifier (LNA) is used as a quantizer. The output of the quantizer is fed back to a structure that uses the power supply to provide a low-noise feedback signal to an LNA load, which serves as a noise shaping loop filter. The order of the noise shaping filter can be increased by using a more complex load including multiple poles and zeros. In another example, a higher order sigma-delta modulator can be constructed using cascaded LNAs followed by a quantizer. In another example, the LNAs may have a tank circuit load to shape the noise. A person having ordinary skill in the art will appreciate that a single or multiple feedback points in such a system.

As described below, quadrature down-conversion is performed by clocking the quantizer or a component, such as a flip-flop, following the quantizer with in-phase (I) and quadrature (Q) local oscillator (LO) outputs. Hence, in the described example the quantizer has a complex structure (i.e., includes one path for the I channel and one path for the Q channel). The output of the quantizer is the down-converted signal used by, for example, a digital receiver.

The down-converted signal is fed back to the LNA in one of a number of manners. In one example, the signal is fed back at the LNA load. At this point, the input transistor of the LNA drives a "virtual ground" and has severely relaxed linearity requirements. Alternatively, the feedback signal may be provided to an input of the LNA via a lossy coupling of the quantizer output to the input of the LNA. By attenuating the feedback signal and its associated noise, such an arrangement helps to ensure that the noise figure contribution made by the feedback is insignificant to the remainder of the receiver lineup.

Whether feeding at the LNA input, LNA source through bondwires and magnetic coupling or to the LNA load, a sigma-delta modulator can be created such that it operates at an RF frequency. In other words, the feedback may be either coupled electrically or magnetically. These techniques can be used to construct very low-power receivers for some wireless standards.

Figure 1:
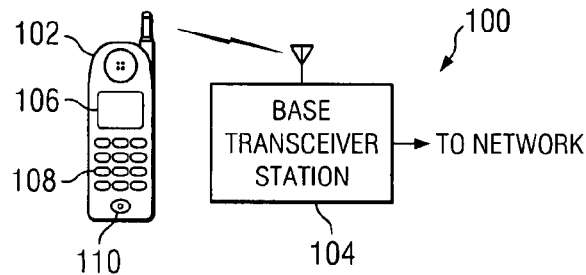
FIG. 1 is a diagram of an example communication system in which the disclosed RF A/D converter and methods may be implemented.

As shown in FIG. 1, an example communication system 100 in which the RF A/D conversion apparatus and methods disclosed herein may be used includes a mobile unit 102 and infrastructure 104. The mobile unit 102 may be implemented using a cellular telephone, such as a global system for mobile communications (GSM) telephone, or any other type of telephone that may operate under the principles of frequency division multiple access (FDMA), time-division multiple access (TDMA), and/or code-division multiple access (CDMA). For example, the mobile unit 102 may operate using the advance mobile phone service (AMPS), IS-95, IS-136, or any other suitable protocol. As will be readily appreciated by those having ordinary skill in the art, the mobile unit 102 may include an earpiece speaker 106, a keypad 108, and a microphone 110 in addition to numerous other components such as communications circuits. As described below, the mobile unit 102 may also include an RF A/D converter.

The infrastructure 104 may be implemented using a base transceiver station (BTS) that is configured for wireless communications with the mobile unit 102. The infrastructure 104 may be coupled to one or more other infrastructure units, the plain old telephone system (POTS), or any other suitable network. As with the mobile unit 102, the infrastructure 104 may be implemented as a GSM base station, or as any other FDMA, TDMA, or CDMA compatible base station. In the example of FIG. 1, the communication protocols used by the mobile unit 102 and the infrastructure 104 are not important to this disclosure. Of course, the communication protocols used by the mobile unit 102 and the infrastructure 104 must be compatible for information exchange to be carried out between the mobile unit 102 and the infrastructure 104.

As described below, in the receive path of the mobile unit 102 certain circuitry, RF A/D converters may be used to reduce the current consumption of the analog devices in the receive path. As appreciated by those having ordinary skill in the art, the analog devices in the receive chain significantly influence current consumption of the receiver. Feedback signals may be provided from the RF A/D converters may be coupled back to a LNA, either at the LNA load or the LNA input.

Figure 2:
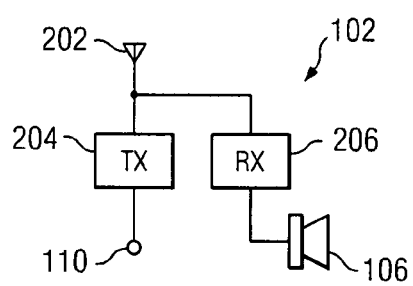
FIG. 2 is a block diagram showing additional detail of the mobile unit of FIG. 1.

As shown in FIG. 2, a mobile unit 102 may include an antenna 202 that is coupled to a transmitter 204 and is also coupled to a receiver 206. In the transmit path, audio from the microphone 110 is processed by the transmitter 204 and broadcast through the antenna to an intended recipient, such as a mobile communications base station. As will be readily appreciated by those having ordinary skill in the art, the transmitter 204 may operate using any number of different communication protocols. Not shown in detail in FIG. 2 is the transmit processing circuitry that may perform analog-to-digital conversion, voice encoding, forward error correction, and/or any other suitable processing that may be required to prepare the voice signals from the microphone 110 for transmission by the antenna 202.

As described in detail below, the receiver 206 includes amplification, RF A/D conversion and downconversion, and any other known or later developed receive processing needed to convert received RF signals at the antenna 202 to audio signals at the speaker. As described below, RF A/D conversion may be used and feedback signals may be coupled back to an LNA load or an LNA input. The feedback signals may affect the LNA loading or the LNA input in a manner that provides feedback for the operation of the RF A/D conversion by providing a low-noise feedback point.

Figure 3:
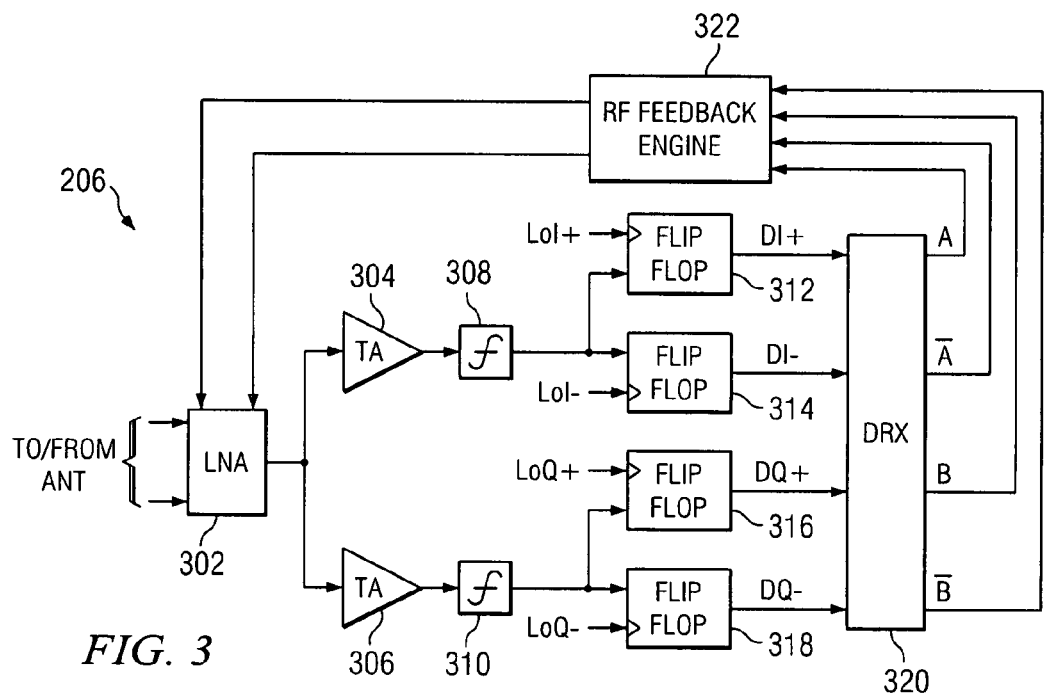
FIG. 3 is a block diagram showing additional detail of an example receiver that may be used to implement the receiver of FIG. 2.

As shown in FIG. 3, an example receiver 206 includes an LNA 302 providing outputs to following I and Q transconductance amplifiers 304, 306, and I and Q quantizer 308, 310. Each quantizer 308, 310 is coupled to two flip-flops 312, 314, 316, 318, the outputs of which are coupled to a digital receiver 320. The digital receiver 320 is coupled to an RF feedback engine 322. A person having ordinary skill in the art will readily appreciate that the quantizers 308, 310 may be constructed with comparators or any other known techniques to produce single or multi-bit output.

The LNA 302 may be any suitable low noise amplifier. As described below, the LNA 302 may be fabricated using transistors, inductors, and any other suitable electronic components. Of course the LNA 302 may be constructed using integrated circuits, discrete circuit components, or any suitable combination of integrated circuits and discrete components. The LNA 302 receives I and Q input signals from an antenna, such as the antenna 202, and amplifies the input signals to produce I and Q output signals that are provided to the transistor amplifiers 304, 306. As described in further detail below, the LNA 302 also receives signals from the RF feedback engine 322 to provide a feedback path to either the input or the output of the LNA.

The transconductance amplifiers 304, 306 amplify the I and Q signals from the LNA 302. The transconductance amplifiers 304, 306 may be constructed using any suitable amplifier configuration. Although the transconductance amplifiers 304, 306 are described herein as being transconductance amplifiers, those having ordinary skill in the art will readily appreciate that such amplifiers may be constructed using transistors and could, alternatively or additionally, be implemented using integrated circuits. Additionally, a person having ordinary skill in the art will appreciate that the transconductance amplifiers may be omitted and the LNA may provide the necessary loop gain. In such a case, the LNA output is coupled to the quantizers.

The amplified I and Q signals are coupled to respective quantizers 308, 310. The quantizer 308, 310 operate at RF frequencies and output signals that are either +1 or −1, based on whether the input signal is above or below zero. That is, the quantizer 308, 310, respectively compare I and Q signals to a zero voltage level and output a logical 1 when the input signal is above zero and output a logical −1 when the input signal is less than zero. Thus, the outputs of the quantizers 308 and 310 are digital bit streams respectively representing the I and Q channels and having values of either +1 or −1, wherein the digital bit stream has an RF frequency that is the same as the frequency of the signals received by the antenna 202. It is common practice to represent +1 with a digital logic value of 1 and −1 with digital logic value of 0.

The digital I signal from the quantizer 308 is coupled to two flip-flops 312, 314, which are D-type flip-flops. A person having ordinary skill in the art will readily appreciate that D-type flips flops are one illustrative example and any other technique known in the art may be used, for example, a latch. The flip-flop 312 is clocked by a square waveform (or bit-stream) having a local oscillator (LO) frequency. Thus, the output of the flip-flop 312 is a sampled version of the RF input signal that is sampled at the LO rate using the square waveform. This waveform represents the positive in-phase data. The digital I signal provided to the flip-flop 314 is sampled by a waveform having the LO frequency that represents the negative in-phase data. A person having ordinary skill in the art will appreciate that any number of clocks, such as a sine or cosine wave, may be used to drive the flip-flops.

Figure 4:
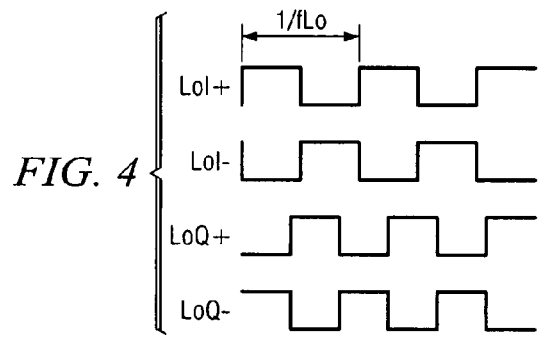
FIG. 4 is a diagram showing waveforms that may used by the digital receiver of FIG. 3.

In a similar manner, the digital RF waveform from the quantizer 310 representing the Q channel is coupled to the flip-flops 316, 318, which are D-type flip-flops. The flip-flop 316 is clocked by a square wave at the LO so that the output of the flip-flop 316 represents the positive Q information in a waveform having a frequency of the LO. The flip-flop 318 is clocked by a negative square wave at the LO so that the output of the flip-flop 318 is the negative quadrature information having the LO frequency. In other words, the square waves, as shown in FIG. 4, represent an ideal LO and the four phases of the clocks are 0°, 90°, 180°, and 270° are represented as I+, Q+, I−, and Q−. A person having ordinary skill in the art will appreciate that any number of clocks, such as a sine or cosine wave, may be used to drive the flip-flops.

The outputs of all of the flip-flops 312, 314, 316, 318 are coupled to the digital receiver 320. The digital receiver 320 may be for example, any suitable digital receiver capable of processing I and Q digital signals. For example, the digital receiver 320 may perform channel selection, resampling, further downconversion, and/or other front end processing. The digital receiver 320 passes the processed I and Q signals to a baseband receiver for further processing and, ultimately, conversion to audio that may be presented to a user at the speaker 106. The digital receiver 320 outputs the I and Q data output the baseband data that is represented in the RF signal. These I and Q data output are provided to the digital baseband demodulator not shown in the figure. In yet another example the feedback loop can be shown may precede the digital receiver 320.

The digital receiver 320 also outputs correction signals that represent the positive and negative senses of the I and Q data at the LO frequency. For the purpose of minimizing loop delay, the correction signals (A, A', B and B') are generated very early in the digital receiver 320. The correction signals are coupled to the RF feedback engine 322, which, as described below, processes such signals and generates feedback signals that are used to load the LNA 302 or, in another example, to affect the input to the LNA 302.

As noted above, the RF feedback engine 322 receives corrective signals from the digital receiver 320 and processes the same to produce feedback signals that affect the operation of the LNA 302. That is, the feedback signals produced by the RF feedback engine 322 alter the operation of the LNA 302 to provide a closed loop system. Thus, the LNA 302 load serves as the noise shaping loop filter.

Figure 5:
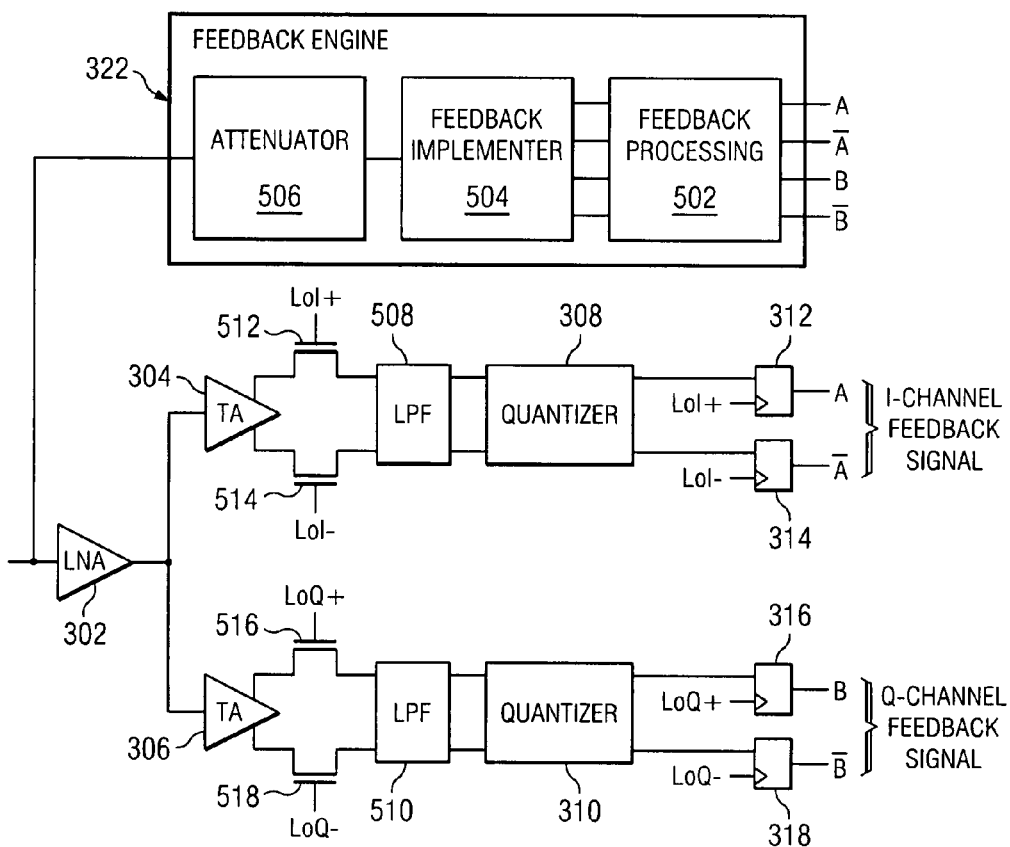
FIG. 5 is a block diagram of an example RF down-converter that includes a feedback path.

As shown in FIG. 5, the output of the I-channel and Q-channel transconductance amplifiers 304, 306 are mixed down using quadrature down-conversion and filtered by a low pass filter (LPF) 508, 510. The output of the filters 508, 510 are quantized using single- or multi-bit quantizers 308, 310 and the outputs of the quantizers 308, 310 are sampled at an RF frequency using I+, Q+, I– and Q–, respectively, by the flip-flops 312, 314, 316, 318. The outputs (A, A', B and B') are applied to the feedback engine 322 that includes, for example, a feedback processor 502, a feedback implementer 504, and an attenuator 506. The feedback processor 502 may be a pass-through block or may filter the input. The feedback implementer 504 up-converts the output of the feedback processor 502 to the RF carrier frequency for the purpose of producing an RF feedback signal. The attenuator 506 is provided for attenuating the feedback signal and any associated noise before applying feedback to the LNA.

The feedback may be applied to the LNA input and/or the LNA output. In such an example, the loop filter of the A/D converter is a composite of the tank circuit in the LNA 302, the lowpass filters 508, 510 following the mixer switches 512, 514, 516, 518 and the filter in the feedback processing digital circuit. The gain of the loop is provided by the LNA 302 and the transconductance amplifiers 304, 306. In yet another example, only the LNA 302 may be used to provide the loop gain by removing the transconductance amplifiers 304, 306. It may also be possible to use more LNA stages inside the loop.

Figure 6:
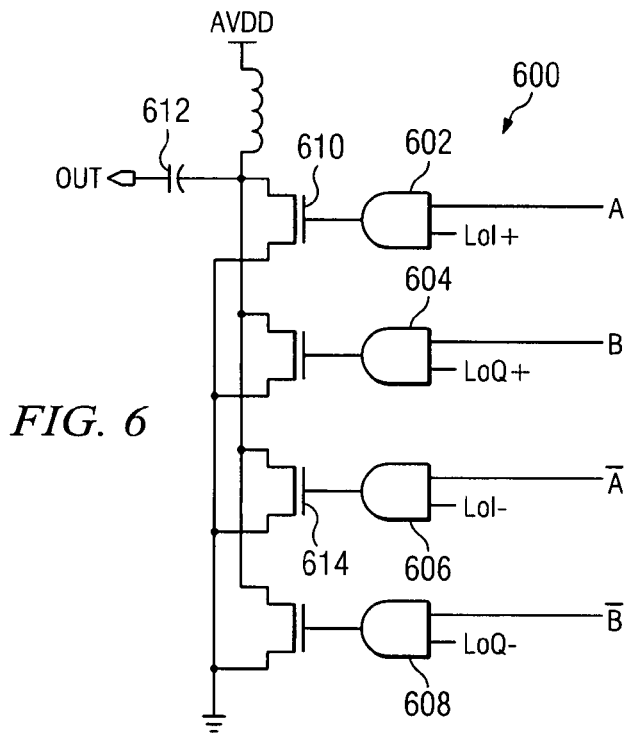
FIGS. 6-9 are schematic diagrams of example RF feedback engines.

FIG. 6 shows one technique of constructing a feedback engine 600 that would work with pass through feedback processing. The baseband representation of the feedback signal is in provided to AND gates 602, 604, 606, 608, which are gates by positive and negative in-phase and quadrature LO signals, as shown in FIG. 6. When the single-bit output of A is a 1, LOI+is gated out to allow an RF output that is in-phase with I+ by turning on the top transistor 610. This output is coupled to the LNA 302 input through a capacitor 612 that may act as an attenuator 506 at the RF carrier frequencies, thereby allowing the signal and noise power to be lowered in power at the LNA 302 input. When the single bit A output is 0, LOI– is gated out to create an RF signal that is in-phase with I– and applied via transistor 614 to the LNA 302 input after undergoing the attenuation in the coupling capacitor 612. The same is true for the Q path which can also generate RF signal in-phase with LOQ+, when the single-bit output of the sigma-delta converter (B) is 1, and LOQ– when it is 0. To those skilled in the art of creating A/D converters, it should be clear that the feedback signal is an analog signal that has a swing around a DC bias or common mode. Generally a decoupling capacitor is used to decouple the dc bias of the feedback signal from the dc bias of the forward path.

Figure 7:
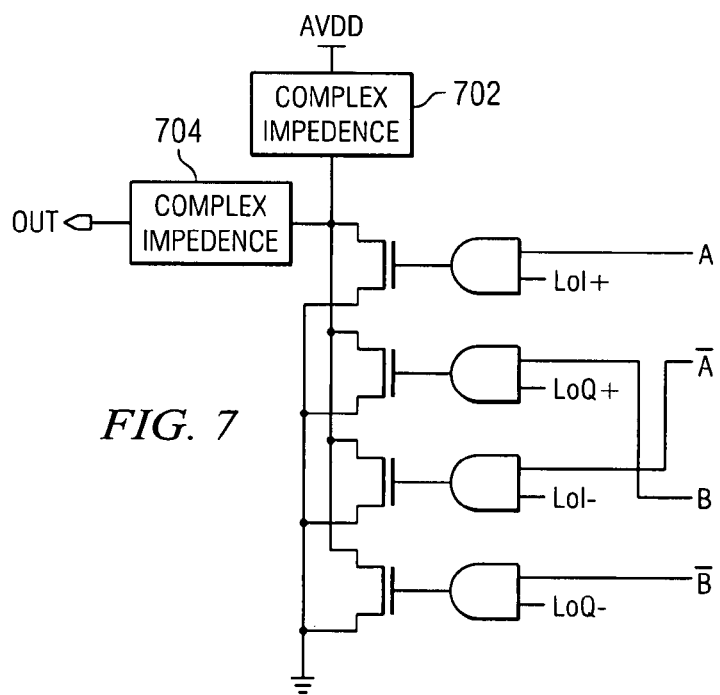
Figure 8:
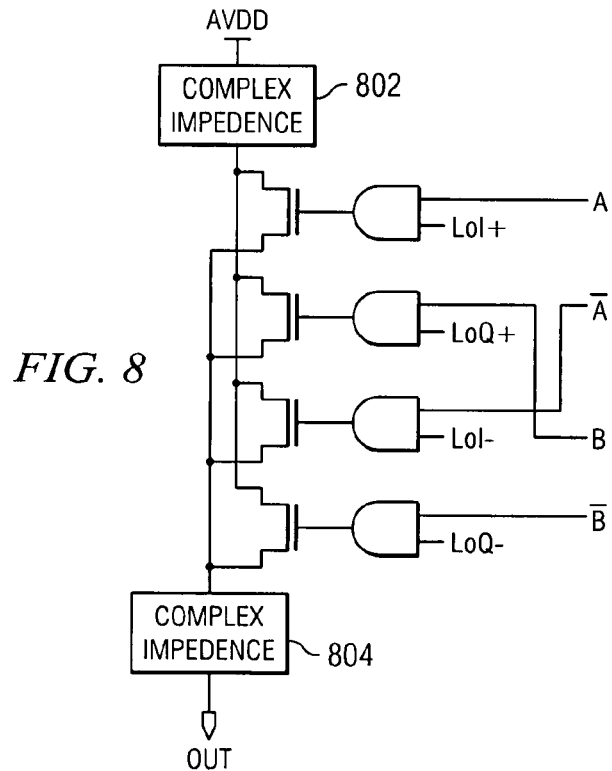

FIGS. 7 and 8 illustrate other examples in which the upconverted feedback signal is passed through a complex impedance 702, 704, 802, and 804, which may be realized by a resistive element, an inductive element, and/or a capacitive element. In FIG. 7, the complex impedance 704 may attenuate or shape the output via a bandpass filter. FIG. 8 shows an example in which couples a power supply to the feedback signal through a switch to provide the RF feedback. The switch is turned on or off by the LO to generate a complex RF signal. A person having ordinary skill in the art will appreciate the examples are merely illustrative and many modifications can be made, such as making the output of the feedback implementer 504 a differential output.

Figure 9:
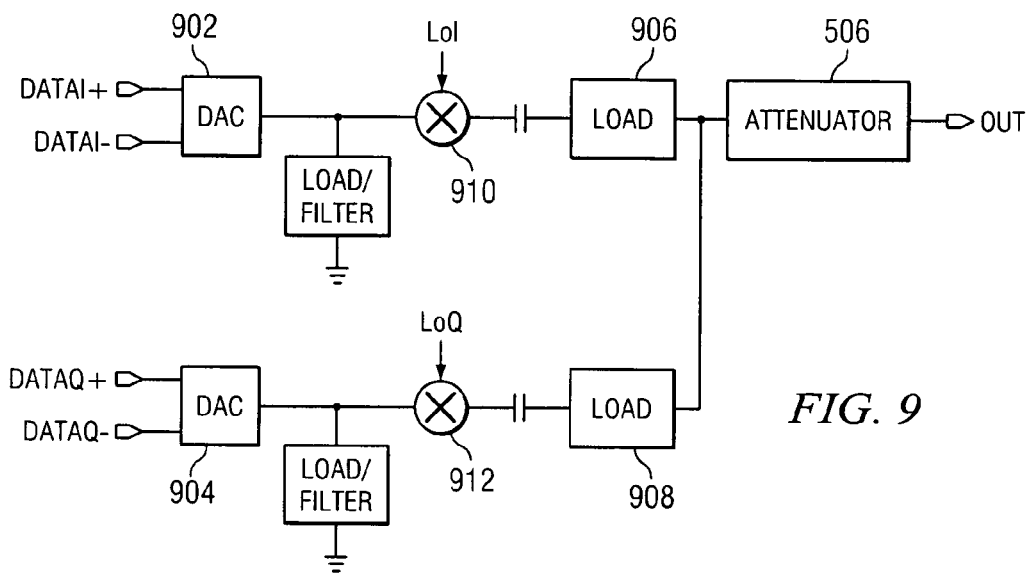

The example of FIG. 9 shows another example for implementing the feedback engine 322. In the example of FIG. 9, the control signals from the digital receiver 320 are converted into analog signals by digital-to-analog converters (DAC) 902, 904. The DACs 902, 904 may be implemented by any known technique to those having ordinary skill in the art, such as a current source which is converted into a voltage by a load. As seen in the example of FIG. 9, the loads 906, 908 may also filter the voltage. The outputs of the DACs 902, 904 may further be up-converted to the RF carrier frequency by mixers 910, 912 before passing through the attenuator 506 of FIG. 5.

Figure 10:
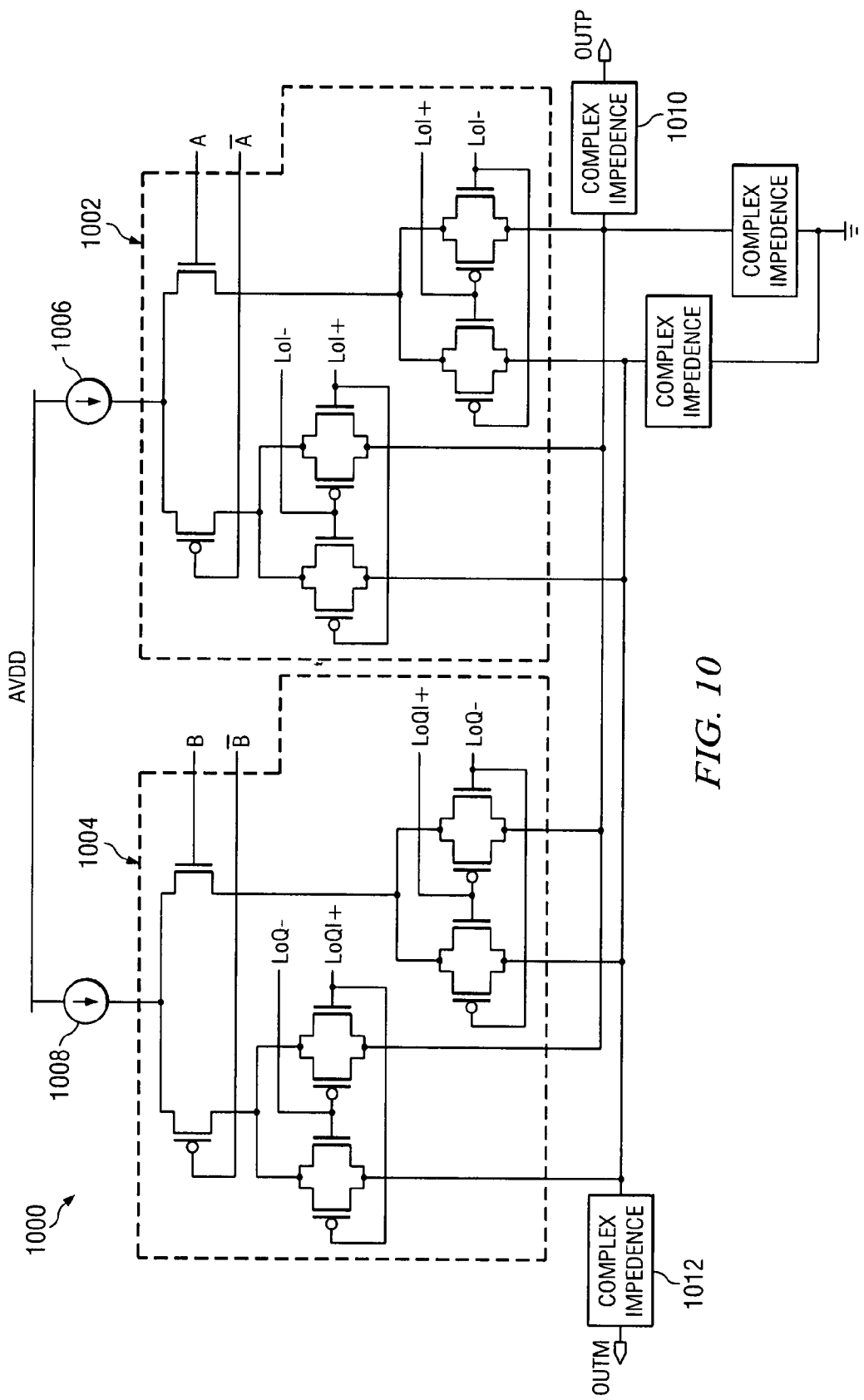
FIGS. 10-12 are schematic diagrams of example RF feedback engines having differential outputs.

FIG. 10 shows an upconverting mixer that is a feedback implementer 1000 having a differential output. Current steering DACs 1002 and 1004 are utilized to steer current from current sources 1006, 1008 to OUTP or OUTM depending the feedback signals. If the output of the converter is a 1, LOI+ going high steers current to OUTP while LOI– steers current to OUTM. The output sees an RF signal with an envelope of +1. When the feedback signal is a 0, LOI+going high steers the current to OUTM while LOI– going high steers the current to OUTP. Hence, an RF signal with envelope of –1 is created. A similar setup exists for the Q-channel and shares the output. Hence, a resulting vector signal can be created whose amplitude is controlled by the duty cycle of 1's or 0's in the I and Q paths, while the phase is controlled by the ratio of the duty cycles. In other words, because the feedback is a streams of 1's representing the magnitude by duty cycles of 1's and 0's, the magnitude and phase of the output RF signal can be controlled by the feedback such that the RF signal magnitude is proportional to absolute value of the feedback and the phase is controlled by the phase of the feedback. The RF output signal can be coupled to the LNA 302 input through complex impedances 1010, 1012 that may consist of resistors, inductors and/or capacitances that provide attenuation and high-Q function at the RF carrier frequency.

Figure 11:
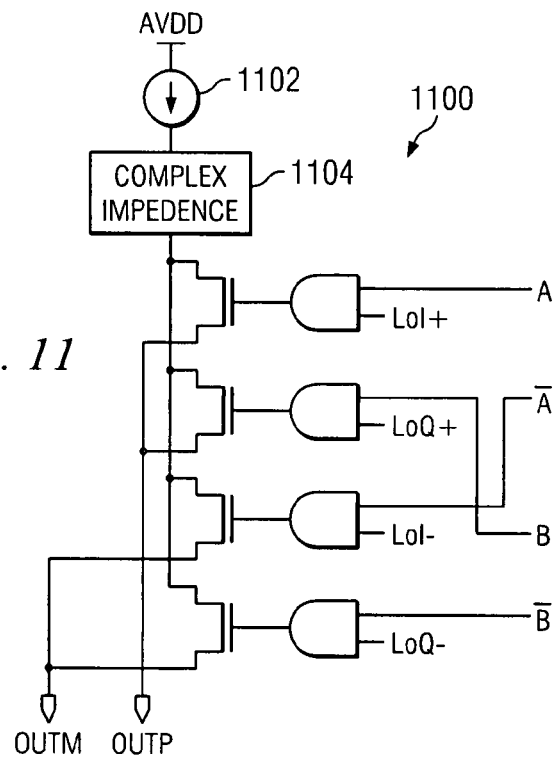

FIG. 11 shows another differential output RF upconverter 1100. A 1 at the feedback output routes the LOI+ signal from a current source 1102 through a complex impedance 1104 to OUTP while a 0 routes LOI– from the current source 1102 through the complex impedance 1104 to OUTM. Similar arrangement exists for the Q-channel data that routes LOQ+ to OUTP and LOQ–to OUTM for 1 and 0 outputs, respectively, via the current source 1102 and the complex impedance 1104.

Figure 12:
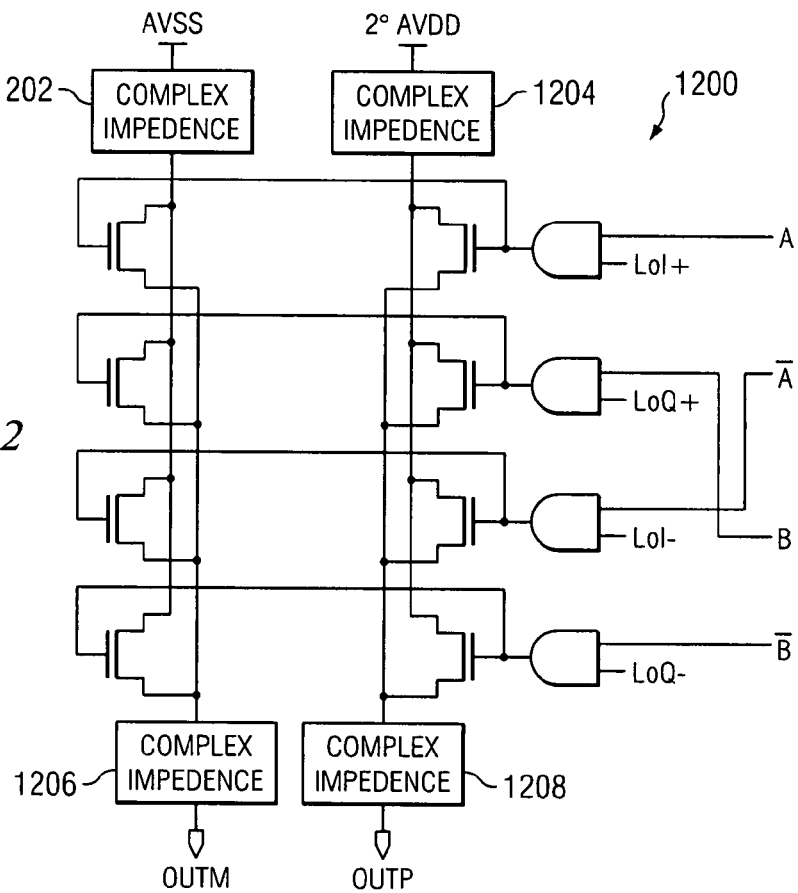

FIG. 12 shows another example of an upconverting mixer 1200 that upconverts feedback signals an RF carrier frequency. The upconverting mixer 1200 uses a similar configuration to those described above, but uses voltage supplies of AVSS and 2 AVDD that are connected through complex impedances 1202 and 1204 and 1206 and 1208.

Figure 13:
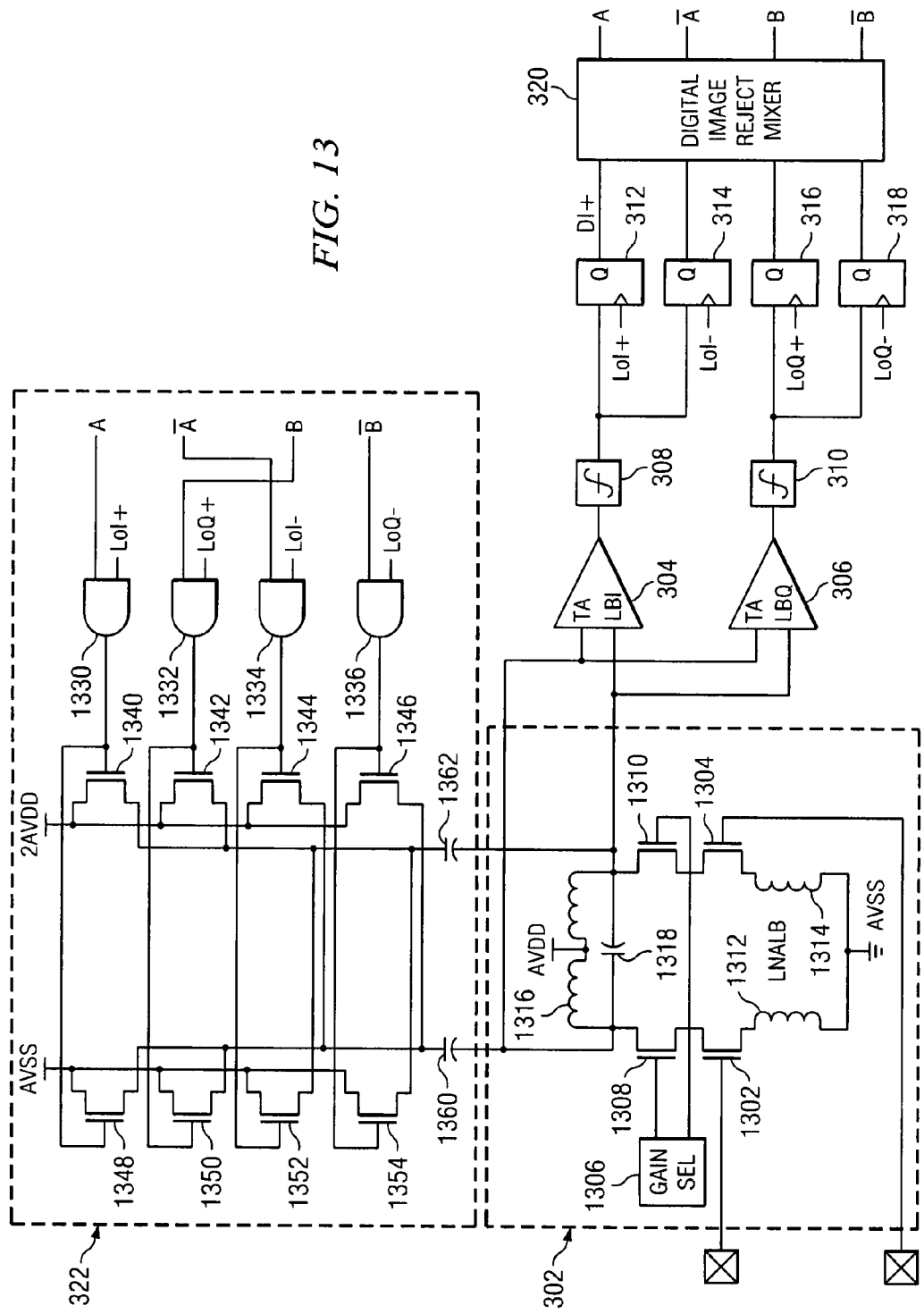
FIGS. 13-17 are schematic diagrams of example RF receivers including example RF A/D converters.

FIG. 13 shows one example implementation of the system described in conjunction with FIGS. 3 and 4, but shows additional detail regarding certain aspects. As shown, the LNA 302 includes input transistors 1302 and 1304 to which the signals from the antenna (e.g., the antenna 202) are coupled. A gain selector 1306 controls gain setting transistors 1308, 1310 that are coupled to the input transistors 1302, 1304. Commonly, these setting transistors control the gm (transconductance) of the top transistor which, in turn controls the gain. Inductors 1312, 1314 are coupled between respective input transistors 1302, 1304 and ground (AVSS). A supply inductor 1316 is coupled in parallel with a capacitor 1318 and is further coupled to a voltage supply (AVDD). Inputs to transistor amplifiers 304, 306 are provided from each side of the capacitor 1318.

The outputs from the transconductance amplifiers 304, 306 are coupled to the quantizers 308, 310 to convert the analog signals from the transistor amplifiers 304, 306 to digital signals, as described above. The quantizer outputs are coupled to flip-flops 312, 314, 316, 318, which, in turn feed the digital receiver 320. The digital receiver 320 produces output signals that are coupled to the feedback engine 322. As shown in FIG. 13, the feedback engine 322 may be implemented using AND gates 1330, 1332, 1334, and 1336, which receive the signals from the digital receiver 320 at one input terminal. The remaining terminals of the AND gates 1330, 1332, 1334, 1336 are coupled to LOI+, LOI−, LOQ+ and LOQ− coupled to the clock inputs of the flip-flops/latches 312, 314, 316, 318.

The outputs of the AND gates 1330, 1332, 1334, 1336 are coupled to transistors 1340, 1342, 1344, 1346, 1348, 1350, 1352, 1354 that are coupled between either ground (AVSS) and a first coupling capacitor 1360 or between two times the supply voltage of the LNA 302 (2AVDD) and a second coupling capacitor 1362. These mixed mode mixers are used to influence the voltage supplied to the LNA 302 via the capacitors 1360, 1362.

This arrangement provides for orthogonal corrections to apply to the LNA 302 via capacitors 1360, 1362 to provide feedback. For example, the positive cosine function represents the quadrature component plus some carrier, the negative cosine function represents the quadrature component minus some carrier, the positive sine component represents the in-phase component plus some carrier (i.e., the leakage to be mulled), and the negative sine component represents the in-phase component minus some carrier. Thus, as will be readily appreciated orthogonal corrections may be made by loading the LNA 302, wherein the sine/cosine of the signal represents a phase shift between in-phase and quadrature and wherein the sense (positive or negative) of the sine/cosine terms affects the polarity of the function.

Figure 14:
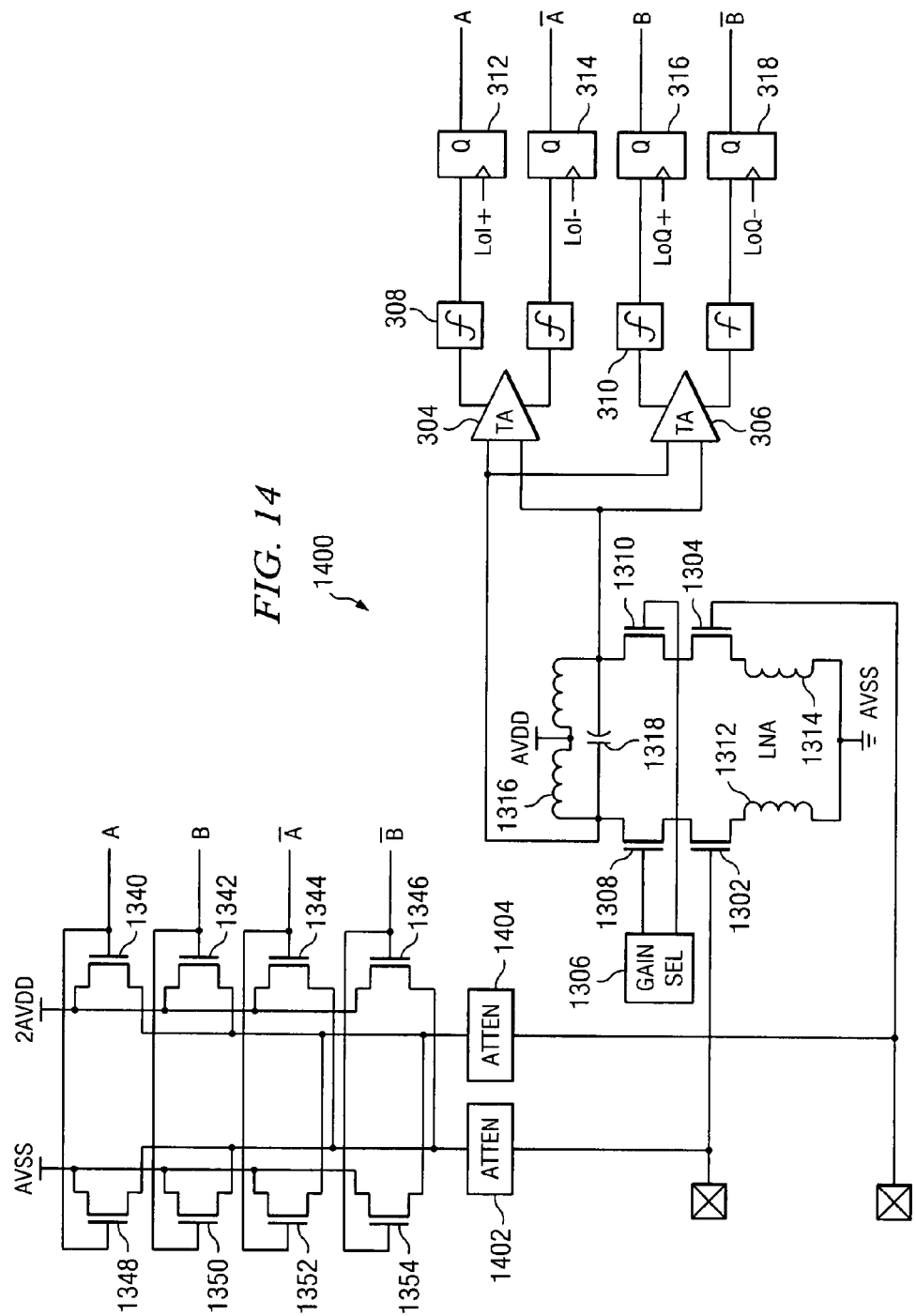

FIG. 14 illustrates another example implementation 1400 of the system described in FIG. 13, but shows the feedback RF signal is directly applied to couple the power supply to the LNA 302 via attenuators 1402, 1404.

Figure 15:
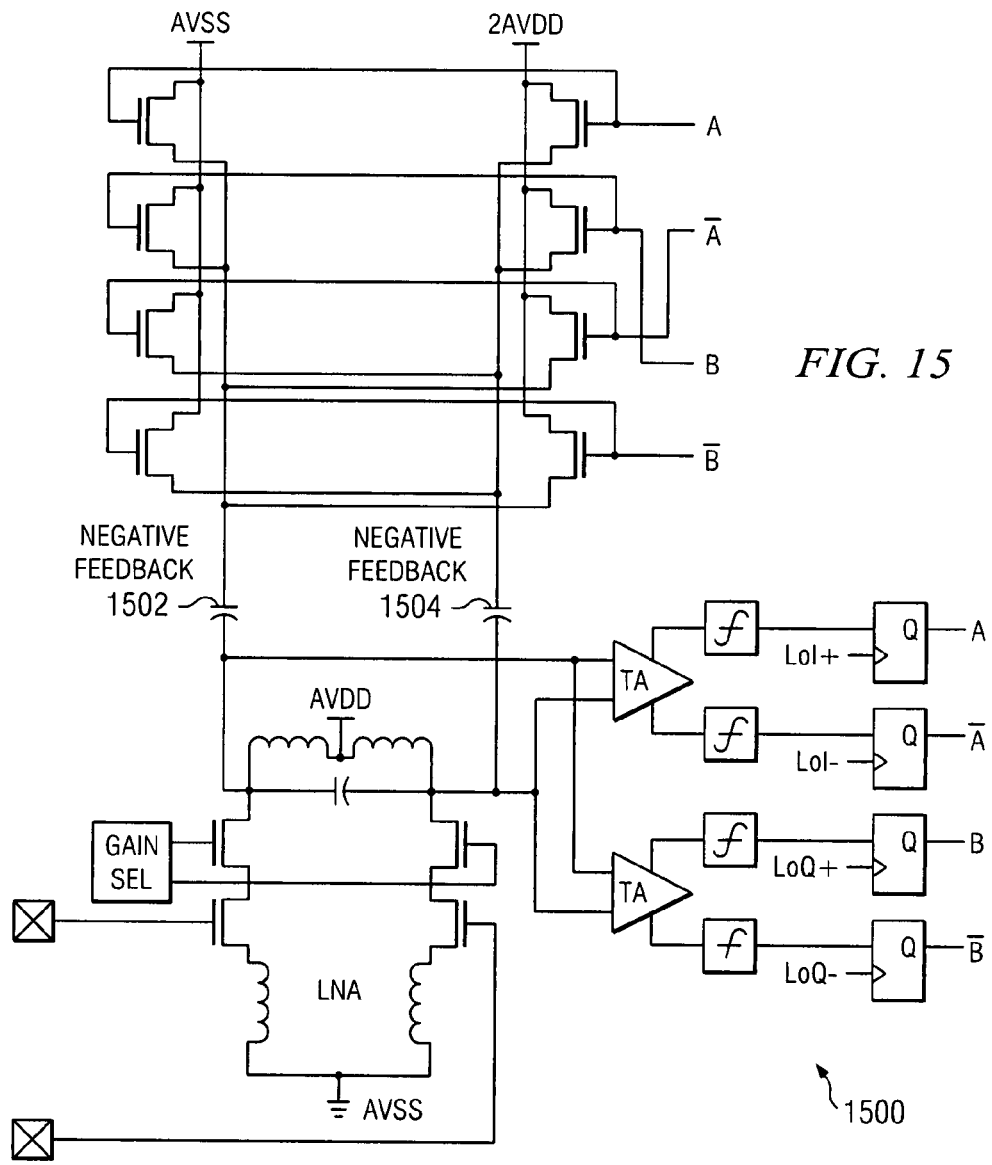

FIG. 15 shows another example RF A/D converter 1500. In the example of FIG. 15, the quantizer output is digitized and is used to up-convert the feedback signal via control switches. A person having skill in the art will appreciate that the examples described may implement a negative feedback via capacitors 1502 and 1504.

Figure 16:
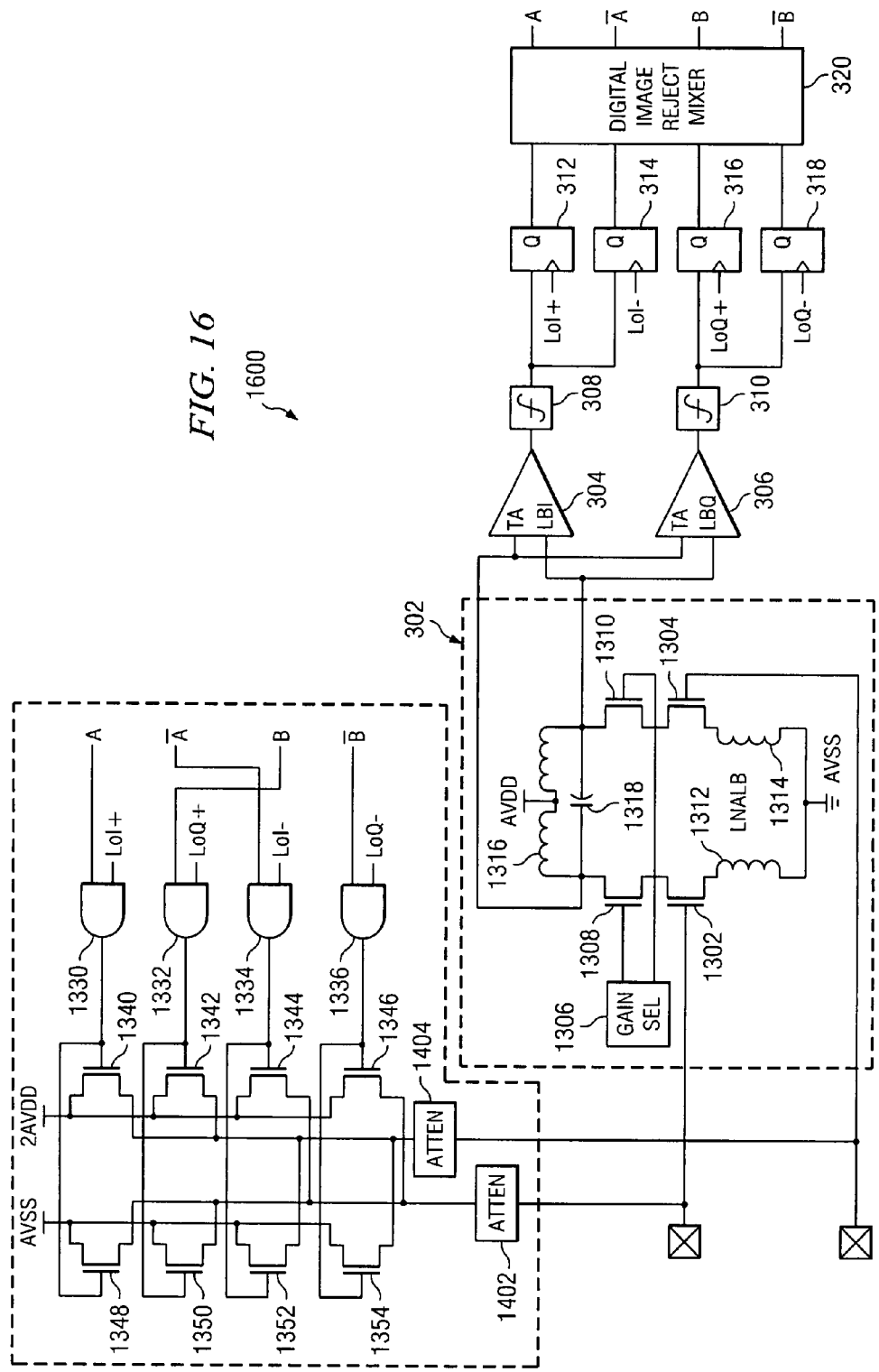

FIG. 16 shows an example 1600 similar to that of FIG. 14, except that a digital image reject mixer 320 may be included. Of course, in any of the foregoing, it is contemplated that feedback may be provided without attenuation.

Figure 17:
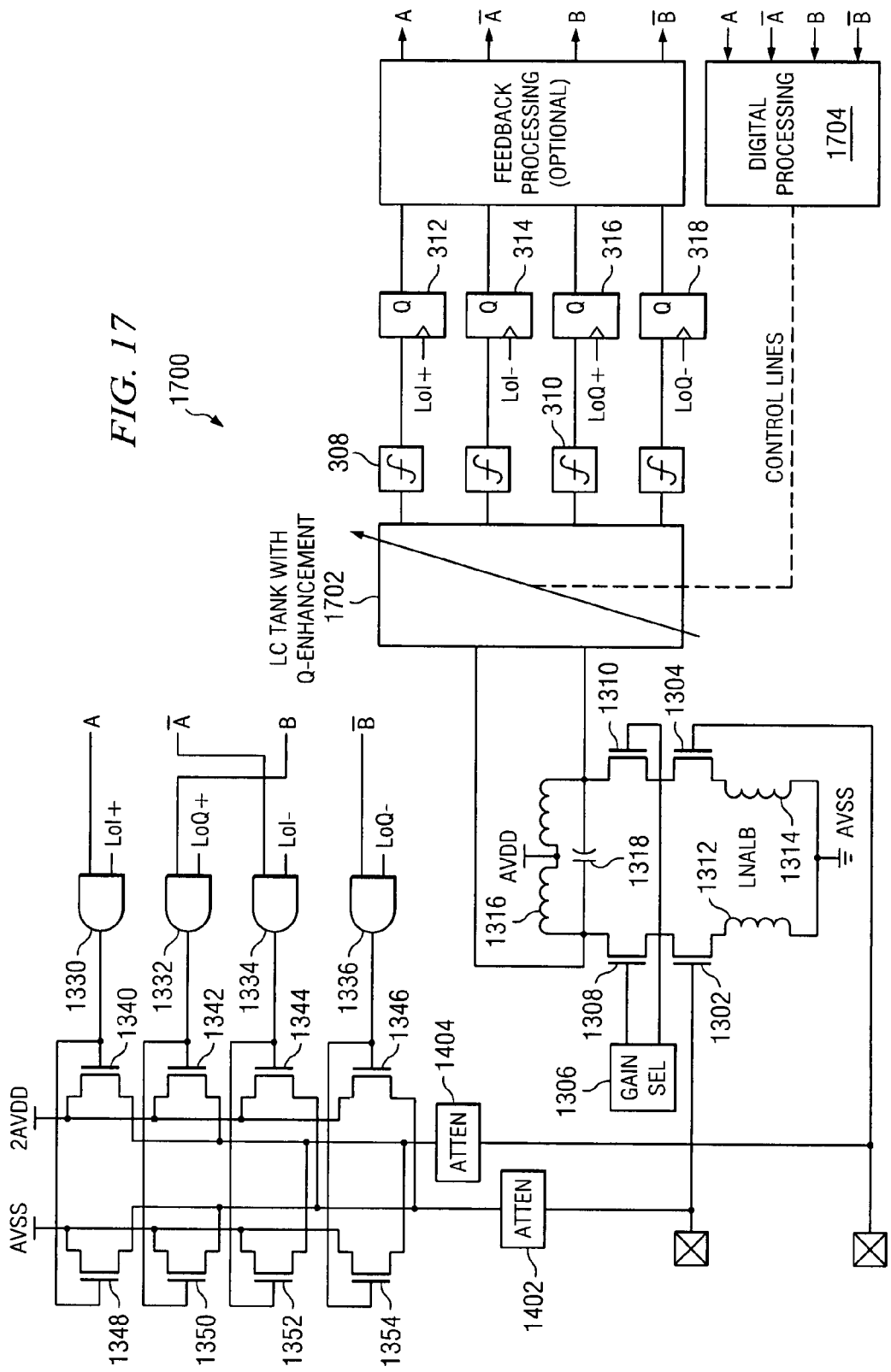

The example of FIG. 17 differs from the example of FIG. 16 in that the example of FIG. 17 includes an LC tank with Q enhancement block 1702 to improve the Q of the system. The block 1702 may be implemented as one of the known methods of Q-enhancement that provides positive feedback to a tank circuit. As appreciated by those having ordinary skill in the art, the positive feedback introduces a "negative" resistor in the tank circuit that cancels out positive resistance in the tank circuit, thereby improving the Q of the resulting tank circuit.

In regards to the RF A/D converter shown in FIG. 17, a separate control loop 1704 may be needed to keep the circuit stable such that it does not start oscillating and also keeps the center of the Q-enhanced tank circuit at the carrier frequency. This is also shown in FIG. 17 where the RFADC digital output is decimated and spectrally analyzed in the digital processing unit 1704. The control loop controls the bias current that in turn controls the magnitude of the negative feedback resistance, in addition to the capacitance of the tank circuit, that is implemented as a bank of varactors that can be switched in or out by turning the corresponding feedback control lines ON or OFF. Oscillatory behavior can be detected by noticing that the output of the RFADC oscillates, thereby requiring the bias current feedback to the Q-enhancement circuit to be reduced such that the negative resistance is decreased. When the noise floor at a predetermined offset frequency band increases, it indicates the need for a higher Q, thereby requiring the bias current to be increased in order to enhance the Q. The centering can also be engaged in a similar manner, whereby the choice to increase or decrease the capacitance on the tank circuit is based on evaluation in the digital processing that the noise contribution is equal at positive and negative offset frequencies. Other approaches may also be applied.

Figure 18:
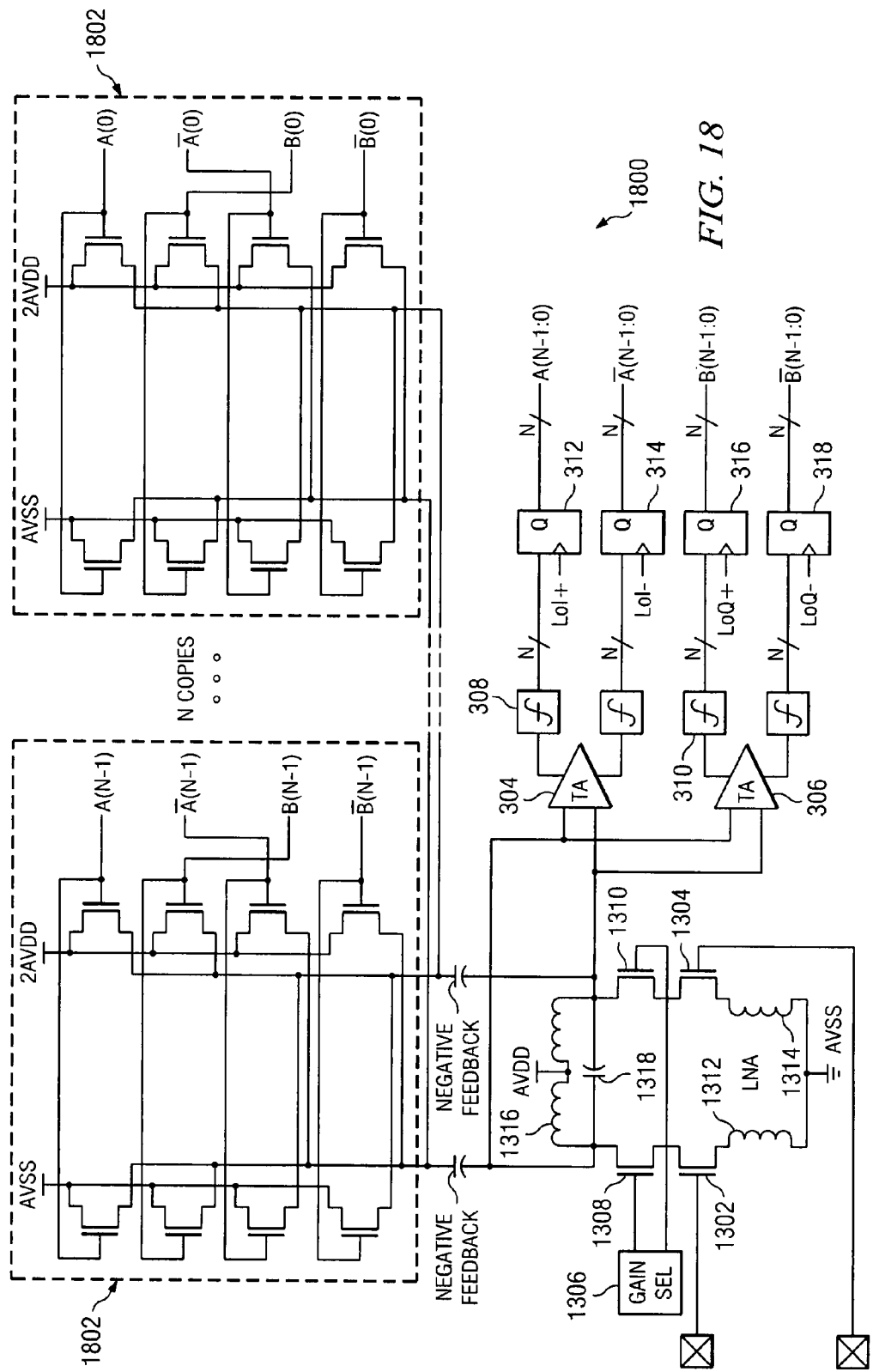
FIGS. 18 and 19 are schematic diagrams of example RF receivers with example multi-bit feedback RF A/D converters.

FIG. 18 shows an example RF A/D converter 1800 which implements a multi-bit feedback. In the example of FIG. 18, the multi-bit quantizer is coupled to multiple flip-flops or latches, each of which controls a single bit up-converter. Thus, the combination of the flip-flops implements an RF D/A converter which feeds into the LNA 302. As shown in FIG. 18, there may be N feedback implementers 1802

Figure 19:
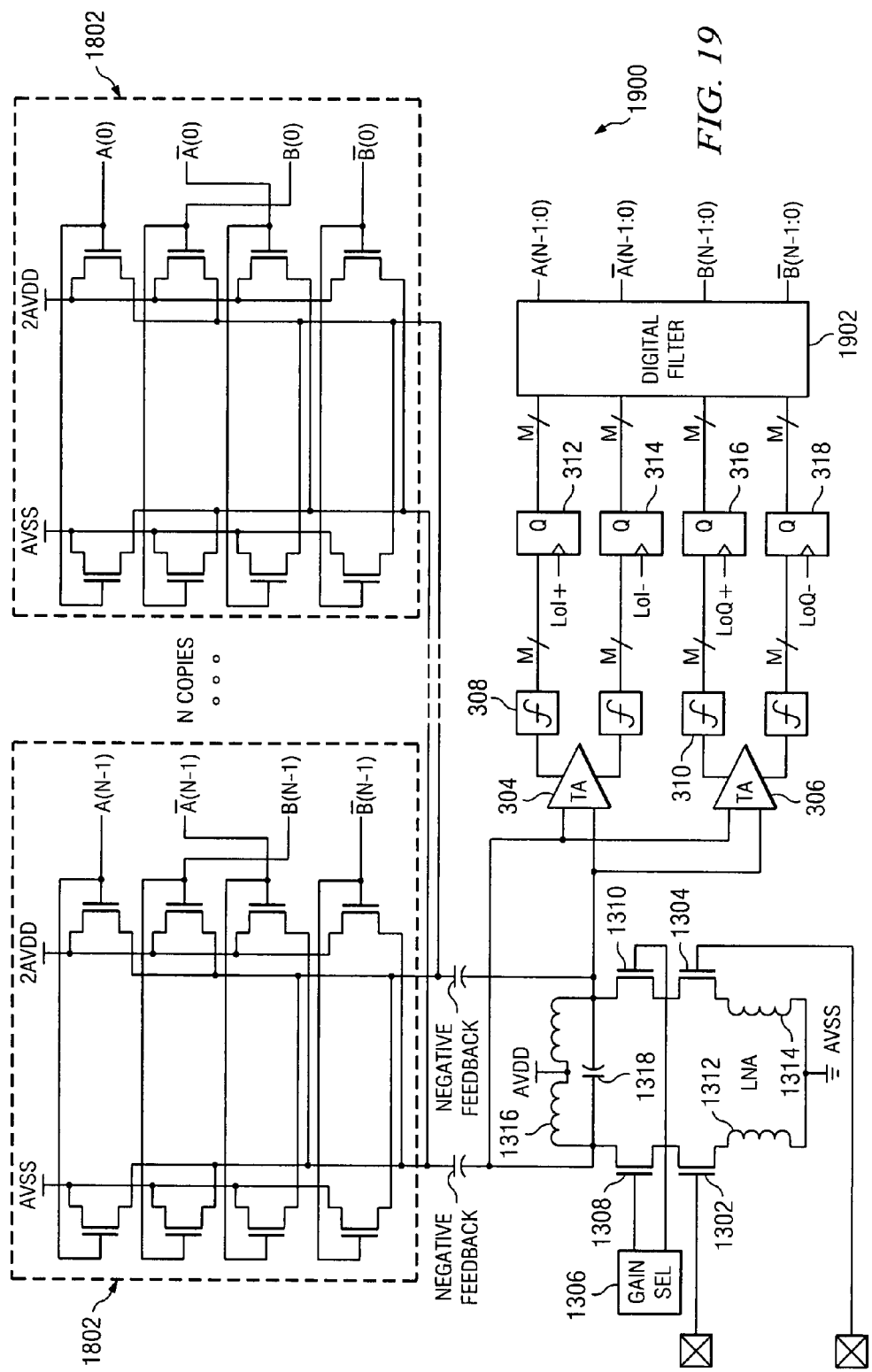

FIG. 19 shows an example RF A/D converter 1900 similar to that of FIG. 18, except the RF A/D converter 1900 includes a digital filter 1902 that that may digitally filter the quantized signal prior to up-conversion. Similar to FIG. 18, the multi-bit quantizer produces a multi-bit output that is passed through a feedback processing circuit that consists of a digital filter to create a desired overall closed-loop signal and noise-transfer functions for the RF A/D converter. The output of the digital filter implements more bits than the multi-bit quantizer (e.g., N>M in FIG. 18).

Having described the architecture of example systems that may be used to perform RF A/D conversion and feedback, an RF A/D conversion process is described. Although the following describes a process through the use of a flow diagram having blocks, it should be noted that the process may be implemented in any suitable manner. For example, the processes may be implemented using, among other components, software, or firmware executed on hardware. However, this is merely one example and it is contemplated that any form of logic may be used to implement the systems or subsystems disclosed herein. Logic may include, for example, implementations that are made exclusively in dedicated hardware (e.g., circuits, transistors, logic gates, hard-coded processors, programmable array logic (PAL), application-specific integrated circuits (ASICs), etc.) exclusively in software, exclusively in firmware, or some combination of hardware, firmware, and/or software. For example, instructions representing some or all of the blocks shown in the flow diagram may be stored in one or more memories or other machine readable media, such as hard drives or the like. Such instructions may be hard-coded or may be alterable. Additionally, some portions of the process may be carried out manually. Furthermore, while each of the processes described herein is shown in a particular order, those having ordinary skill in the art will readily recognize that such an ordering is merely one example and numerous other orders exist. Accordingly, while the following describes example processes, persons of ordinary skill in the art will readily appreciate that the examples are not the only way to implement such processes.

Figure 20:
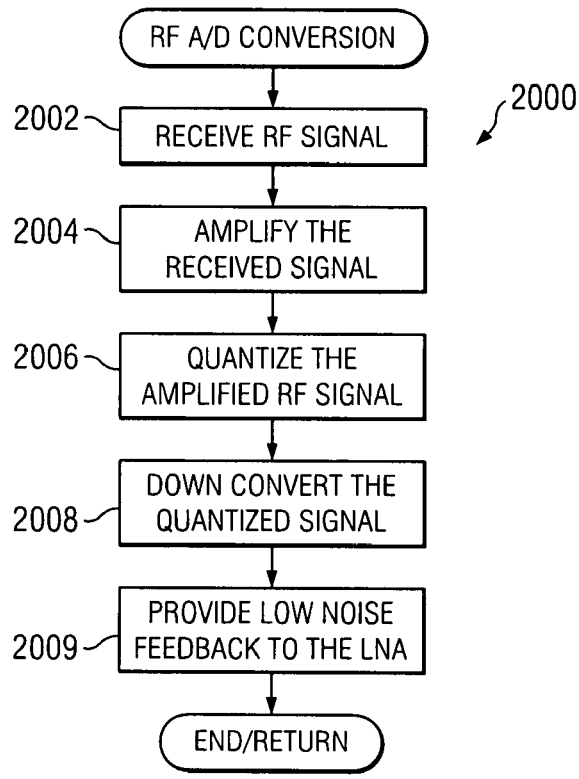
FIG. 20 is a flow diagram of an example A/D conversion process.

An example RF A/D conversion process 2000 is illustrated in FIG. 20. The process 2000 may be implemented using one or more software programs or sets of instructions or codes that are stored in one or more memories (e.g., the memories 2104, 2118, and/or 2120 of FIG. 9) and executed by one or more processors (e.g., the processor 2112). However, some of the blocks of the process 2000 may be performed manually and/or by some other device. Additionally, although the process 2000 is described with reference to the flowchart of FIG. 20, persons of ordinary skill in the art will readily appreciate that many other methods of performing the process 2000 may be used. For example, the order of many of the blocks may be altered, the operation of one or more blocks may be changed, blocks may be combined, and/or blocks may be eliminated.

The process 2000 converts incoming analog RF signals to digital signals sampled at an intermediate frequency without the use of analog input circuitry. The process 2000 begins when an RF signal is received (block 2002). The received signal is amplified (block 2004), and quantized (block 2006). A person having ordinary skill in the art will appreciate that the RF signal may be bandpass filtered between block 2004 and 2006. As described above, the quantization may be performed using one or more comparators that operate at RF frequencies to convert incoming analog RF signals to digital values. After quantization, the quantized signals, which are now digital, are downconverted (block 2008) using, for example, sampling circuitry, such as a flip-flop clocked at an IF (LO) frequency. A person having ordinary skill in the art will appreciate that the quantized signal may be lowpass filtered after block 2008. To ensure proper operation of the system feedback signals are provided (block 2010). The feedback signals may be coupled to LNA input, LNA output, or to any other suitable connection. A person having ordinary skill in the art will appreciate that the feedback polarity may be negative, but may also be positive.

Figure 21:
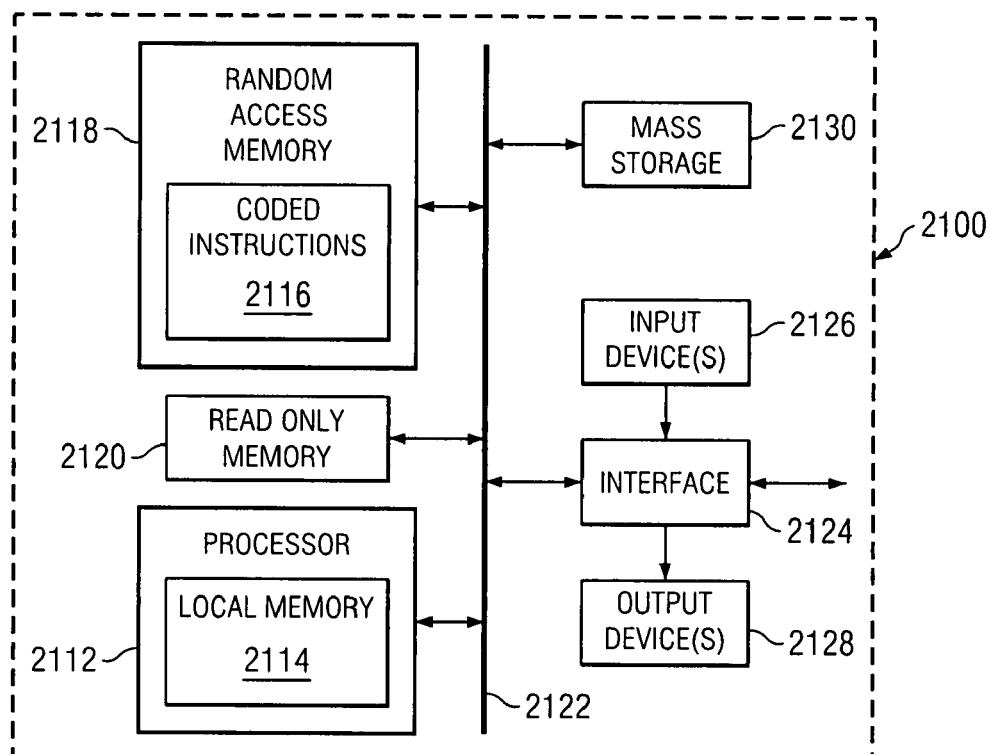
FIG. 21 is a block diagram of an example processor system on which the systems in the foregoing block diagrams and the foregoing processes may be implemented.

FIG. 21 is a block diagram of an example computer 2100 capable of implementing the apparatus and methods disclosed herein. The computer 2100 can be, for example, a processing device, a server, a personal computer, a personal digital assistant (PDA), an Internet appliance, a DVD player, a CD player, a digital video recorder, a personal video recorder, a set top box, or any other type of computing device.

The system 2100 of the instant example includes a processor 2112 such as a general purpose programmable processor. The processor 2112 includes a local memory 2114, and executes coded instructions 2116 present in the local memory 2114 and/or in another memory device. The processor 2112 may execute, among other things, machine readable instructions implementing the process represented in FIG. 21. The processor 2112 may be any type of processing unit, such as one or more microprocessors from the Texas Instruments OMAP® family of microprocessors. Of course, other processors from other families are also appropriate.

The processor 2112 is in communication with a main memory including a volatile memory 2118 and a non-volatile memory 2120 via a bus 2122. The volatile memory 2118 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 2120 may be implemented by flash memory and/or any other desired type of memory device. Access to the main memory 2118, 2120 is typically controlled by a memory controller (not shown).

The computer 2100 also includes an interface circuit 2124. The interface circuit 2124 may be implemented by any type of interface standard, such as a serial bus, an Ethernet interface, a universal serial bus (USB), and/or a third generation input/output (3GIO) interface.

One or more input devices 2126 are connected to the interface circuit 2124. The input device(s) 2126 permit a user to enter data and commands into the processor 2112. The input device(s) can be implemented by, for example, a keyboard, a mouse, a touchscreen, a track-pad, a trackball, an isopoint and/or a voice recognition system.

One or more output devices 2128 are also connected to the interface circuit 924. The output devices 2128 can be implemented, for example, by display devices (e.g., a liquid crystal display, a cathode ray tube display (CRT)), by a printer and/or by speakers. The interface circuit 2124, thus, typically includes a graphics driver card.

The interface circuit 2124 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The computer 2100 also includes one or more mass storage devices 2130 for storing software and data. Examples of such mass storage devices 2130 include floppy disk drives, hard drive disks, compact disk drives and digital versatile disk (DVD) drives.

As an alternative to implementing the methods and/or apparatus described herein in a system such as the device of FIG. 21, the methods and or apparatus described herein may be embedded in a structure such as a processor and/or an ASIC (application specific integrated circuit).

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalent

The invention claimed is:

1. Radio frequency analog to digital converter circuitry comprising:
  A. a low noise amplifier having an antenna input, a feedback input, and two outputs;
  B. two transconductance amplifiers, each having two inputs connected with the two outputs of the low noise amplifier and each having an output;
  C. two quantizers, each having an input connected with the output of a transconductance amplifier and an output;
  D. a local oscillator providing multiphase clock;
  E. four flip-flops, each having a logic input, a logic output, and a clock input, the logic inputs of two flip-flops being connected with the output of one quantizer and the logic inputs of the other two flip-flops being connected with the output of the other quantizer, each clock input being connected with one of the multiphase clock signals; and
  F. an RF feedback engine having four inputs coupled with the four outputs of the flip-flops and an output connected with the feedback input of the low noise amplifier.

2. The converter circuitry of claim 1 in which the RF feedback engine includes feedback processing circuitry having the four inputs and having four outputs, feedback implementing circuitry having four inputs connected with the four outputs of the feedback processing circuitry and having an output, and attenuator circuitry having an input connected with the output of the feedback processing circuitry and an output connected with the feedback input of the low noise amplifier.

3. The converter circuitry of claim 1 in which the RF feedback engine includes gating circuitry having inputs coupled with the outputs of the flip-flops, inputs connected with the multiphase clock signals, and outputs, transistors having gates connected with the outputs of the gating circuitry, and sources and drains connected between VDD, an inductor, and ground, and a capacitor having one lead connected with the transistors and having another lead connected to the feedback input of the low noise amplifier.

4. The converter circuitry of claim 1 in which the RF feedback engine includes gating circuitry having inputs coupled with the outputs of the flip-flops, inputs connected with the multiphase clock signals, and outputs, transistors having gates connected with the outputs of the gating circuitry, and sources and drains connected between VDD, a first complex impedance, and ground, and a second complex impedance having one lead connected with the transistors and having another lead connected to the feedback input of the low noise amplifier.

5. The converter circuitry of claim 1 in which the RF feedback engine includes gating circuitry having inputs coupled with the outputs of the flip-flops, inputs connected with the multiphase clock signals, and outputs, transistors having gates connected with the outputs of the gating circuitry, and sources and drains connected between VDD, a first complex impedance, and a second complex impedance, and the second complex impedance having an output connected to the feedback input of the low noise amplifier.

6. The converter circuitry of claim 1 in which the antenna input and the feedback input are the same input.

7. The converter circuitry of claim 1 in which the low noise amplifier has two feedback inputs and the RF feedback engine includes transistor and complex impedance circuitry having the four inputs coupled with the outputs of the flip-flops, inputs connected with the multiphase clock signals, and two outputs connected with the feedback inputs of the low noise amplifier.

8. The converter circuitry of claim 1 in which the low noise amplifier has two feedback inputs and the RF feedback engine includes gating, transistor, and complex impedance circuitry having the four inputs coupled with the outputs of the flip-flops, inputs connected with the multiphase clock signals, and two outputs connected with the feedback inputs of the low noise amplifier.

9. The converter circuitry of claim 1 including digital circuitry connecting the outputs of the flip-flops with the four inputs of the RF feedback engine.

10. The converter circuitry of claim 1 in which the low noise amplifier includes gain selector circuitry.

11. The converter circuitry of claim 1 in which the multiphase clock signals include clock signals at 0, 90, 180, and 270 degrees.

* * * * *